United States Patent [19]

Frushour

[11] Patent Number: 4,697,142
[45] Date of Patent: Sep. 29, 1987

[54] PRINTED CIRCUIT CONDUCTOR TEST SYSTEM

[75] Inventor: James E. Frushour, Endwell, N.Y.

[73] Assignee: IBM Corporation, Armonk, N.Y.

[21] Appl. No.: 718,466

[22] Filed: Apr. 1, 1985

[51] Int. Cl.[4] ............................................. G01R 31/02
[52] U.S. Cl. ............................ 324/158 R; 324/73 PC; 324/500
[58] Field of Search ............... 324/73 PC, 110, 158 R, 324/543

[56] References Cited

U.S. PATENT DOCUMENTS

| | | | |
|---|---|---|---|
| 2,605,322 | 7/1952 | Edsall | 324/51 |
| 3,366,055 | 1/1968 | Hollander, Jr. | 324/158 R |
| 3,373,356 | 3/1968 | Camenzind | 324/158 R |
| 3,392,332 | 7/1968 | Christensen | 324/110 |
| 3,772,590 | 11/1973 | Mikulecky et al. | 324/424 |
| 4,140,965 | 2/1979 | Neal | 324/110 |

OTHER PUBLICATIONS

Meier, H. E.; "Circuit Board Testing"; IBM Tech. Dis. Bull.; vol. 23; No. 9; Feb. 1981; p. 4092.
Meier, H. E.; "Testing Printed Circuitry"; IBM Tech. Dis. Bull.; vol. 23; No. 9; Feb. 1981; p. 4091.

Primary Examiner—Ernest F. Karlsen
Attorney, Agent, or Firm—Perman & Green

[57] ABSTRACT

A system for testing conductor lines in a printed circuit board includes circuitry for the burning out of constricted regions of the printed circuit lines so as to insure that such defects are noticed. The system includes circuitry for measuring the resistance in a path through a printed circuit line under test and including connecting circuitry to a generator of an electrical pulse. A resistor network and switching circuitry is employed for adjusting the resistance of the path through a desired value. The electrical pulse is generated by the discharge of a capacitor previously charged to a predetermined value of voltage, the discharge occurring via a pulsing circuit switch which limits the duration of the pulse through a predetermined value of sufficiently short duration to prevent damage to the circuit board associated with excessive heating. Monitoring circuitry including a peak detector and comparators is employed for sensing a sudden change in test current amplitude, as well as test currents having amplitudes of an acceptable range, for terminating the test current pulse prematurely upon an indication of burnout, thereby to protect the circuit board.

8 Claims, 6 Drawing Figures

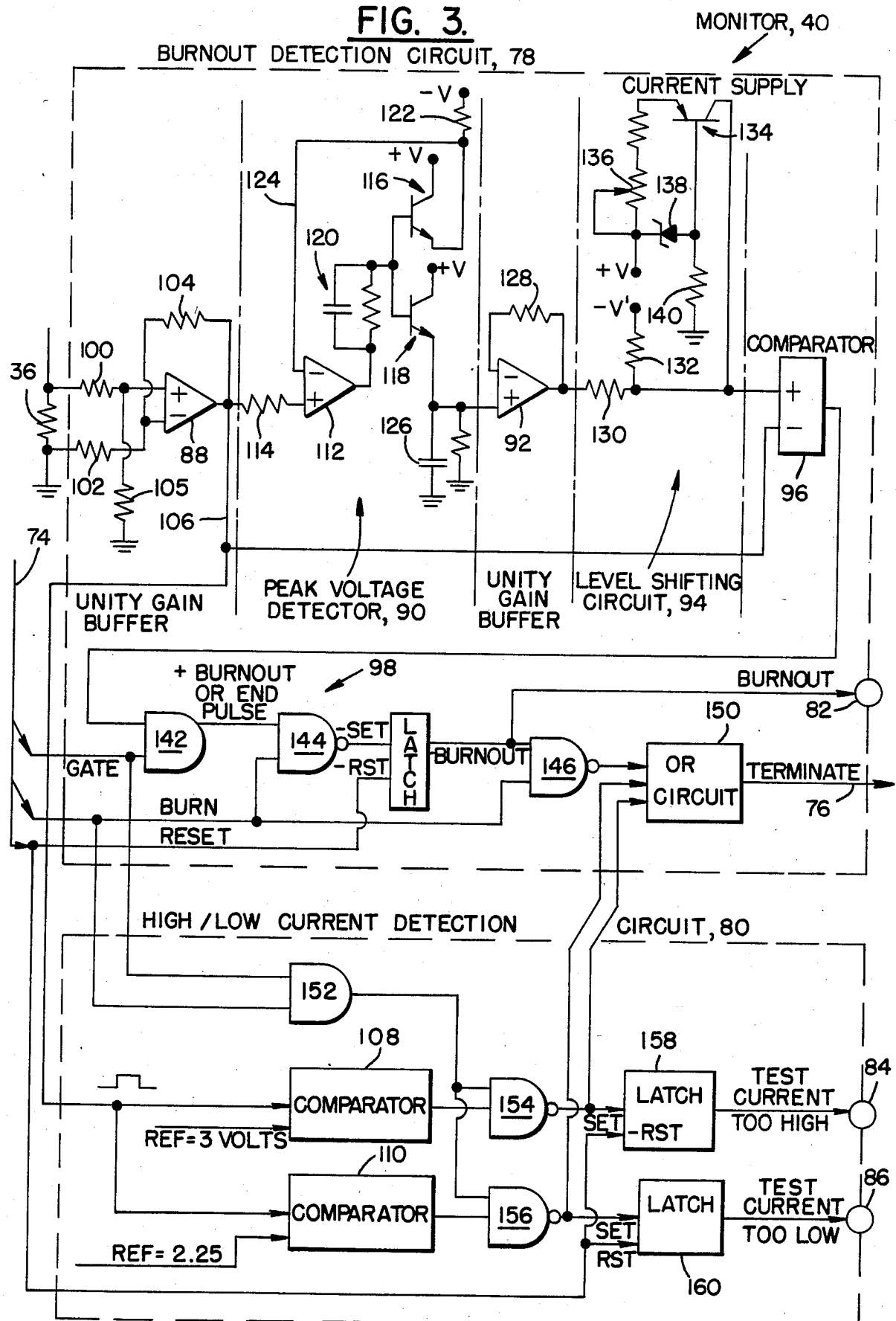

PRINTED CIRCUIT CONDUCTOR TEST SYSTEM

BACKGROUND OF THE INVENTION

This invention relates to the testing of printed circuit boards and, more particularly, to the sensing of excessively thin strip conductors by use of burnout current pulses.

Printed circuit boards are manufactured in large numbers for the electronics industry. Such boards are often constructed with many strip conductors interconnecting numerous electronic components. Some of the strip conductors may be lengthy as compared to dimensions of the circuit board. The generally accepted mode of manufacture employs photolithography for the production of a laminated circuit board wherein an outer metallic layer is etched to form thin ribbon-shaped conductor strips disposed on an insulating substrate.

The current carrying capacity of a strip conductor is dependent on the cross sectional area of the conductor and, hence, on the thickness and the width of the strip conductor. The thickness of a strip conductor is fixed by the thickness of the metal layer from which the conductor is formed. The width of the strip conductor is established by the photolithography process, and may be selected during the design of masks used in the photolithography process to impart a desired current-carrying capacity to the strip conductor.

A problem arises in that the width of a strip conductor cannot be controlled as precisely as is desired in the manufacture of a printed circuit board. As a result, some variations occur in the width characterized by both increases and decreases from a nominal or preselected value of the width. Of particular concern is a reduction in width, or necking down of the conductor, which presents a hazard in that the circuit board may fail by either of two modes.

The conductor may break because of physical stresses which build up in the region of reduced cross section. Such breakage inhibits the flow of current in the conductor with an attendant failure in operation of an electric circuit on the circuit board. Alternatively, the conductor may present a high resistance to the flow of electric current in the region of reduced cross section. The resultant flow of current may be too small for proper operation of the electric circuit. Also, a flow of electric current through the region of reduced cross section may produce excessive heating, or hot spot, which may eventually melt the conductor leaving an open circuit which stops further flow of the current.

One attempted solution to the foregoing problem involves visual inspection of the circuit board to ascertain whether all of the strip conductors are properly formed. However, the visual inspection has not been wholly satisfactory in that it is dependent on human judgment, the necked down region may be irregularly shaped, and there is no accurate measurement of the cross section.

Visual inspection can be facilitated by a burnout technique wherein a pulse of current is applied to the strip conductor, the magnitude of the current being large enough to melt of vaporize the reduced cross-sectional area leaving a visible opening in the conductor. However, such current pulsing must be carefully controlled so as to avoid damaging other portions of the circuit board. The technique had been avoided with particularly delicate circuit boards because presently available current regulation circuits do not provide as high a level of control as would be desirable. Also, circuitry for the detection of a burnout, such as by differentiating a current waveform, does not provide as high a level of control as would be desirable. Even with the aid of the burnout technique, the visual inspection is time consuming and subject to human error and, hence, disadvantageous.

SUMMARY OF THE INVENTION

The foregoing problem is overcome and other advantages are provided by a method and system for the testing of electrically conducting lines on a printed circuit board. In accordance with the invention, a pulse of current is applied to a line of the printed circuit board for testing the line for its capacity to conduct electric current. The amplitude and the duration of the current pulse are sufficient to burn out a portion of the line having a cross sectional area less than approximately one square mil, this value of area being generally adequate to insure reliable operation of a circuit on the circuit board. If no burnout occurs during the test, the line of the circuit board is considered to be properly formed. If burnout does occur, the circuit board must be withdrawn from an assembly operation to be repaired or discarded, and the line is considered to have been defective originally.

The current pulse is generated by the partial discharge of a capacitor to minimize the chance of excessive energy being applied to a necked-down region of the conductive line, and thereby avoid possible damage to the circuit board. The current is coupled from the capacitor to the line under test by a resistor which limits the maximum amount of current in the event that a short circuit develops during the test, such limitation of current flow protecting the circuit board from damage during the testing procedure. A further resistor of relatively small value is inserted in series with the line for measurement of current by a monitoring of voltage drop across the current sensing resistor. A pulsing circuit, or switch, applies a substantially constant voltage from the capacitor to the resistor during the interval of the pulse. A correspondingly uniform current pulse flows through the line if the line is properly constructed.

Further, in accordance with the invention, circuitry is employed for the generation of time reference signals which permit observation of current flow during predesignated intervals of time for determination of the nature of the waveform of the current pulse flowing through the line. Burnout is noted from a waveform showing a sudden decrease in current amplitude during the interval of time that the capacitor voltage is being applied via the resistor to the line. The foregoing observation of the current flow is accomplished by a monitoring circuit which also monitors the amplitude of the current to ascertain that the current amplitude is in a proper range for conduction of the test. Upon an indication of burnout or improper current range, the monitor circuit applied a signal to the pulsing circuit for termination of the current so as to prevent damage to the circuit board. The foregoing features of the invention can be incorporated into an automatic testing system which measures the series resistance and adjusts the value of the resistance for proper value of current pulse, after which the pulsing and timing circuitry are activated for proceeding with the testing of the conductive line in the circuit board.

While the invention is particularly useful in the testing of conducting lines in a printed circuit board, it is to be understood that the methodology and apparatus of the invention may be employed in the testing of current-carrying capacity of other forms of conductors.

BRIEF DESCRIPTION OF THE DRAWING

The foregoing aspects and other features of the invention are explained in the following description taken in connection with the accompanying drawing wherein:

FIG. 3 is an electrical schematic diagram of a monitor of FIG. 1 which, in accordance with the invention, measures a response of the line conductor to the test current pulse;

DETAILED DESCRIPTION

Figure 1:
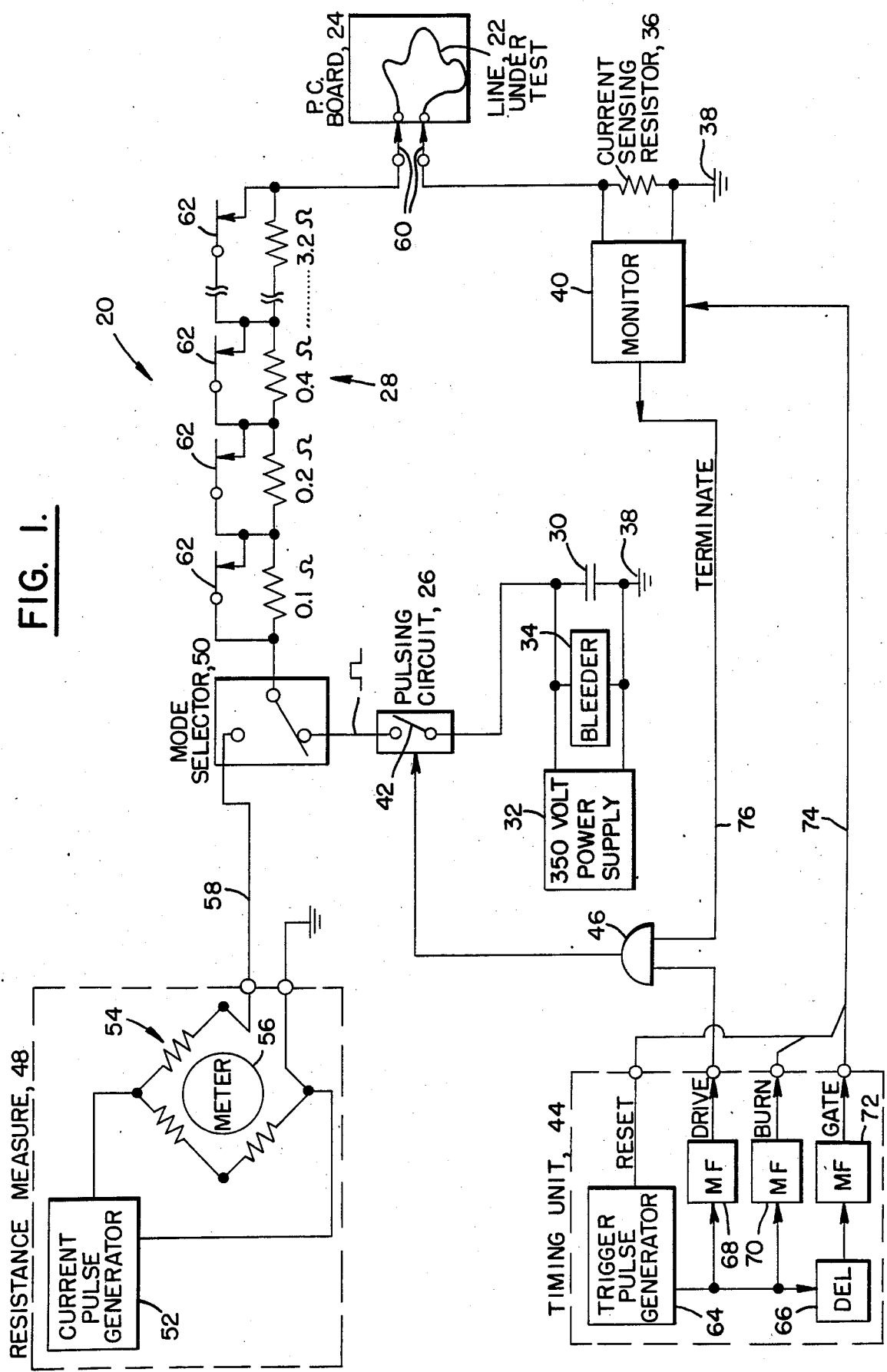
FIG. 1 is an electrical schematic diagram showing connection of a resistor network and pulsing circuit to a printed circuit board for measuring responsivity of a line conductor of the circuit board to a current pulse, in accordance with the invention.

FIG. 1 shows a system 20 constructed in accordance with the invention for testing the current carrying capacity of an electrically conductive line 22 of a printed circuit board 24. The testing involves the application of a current pulse by a pulsing circuit 26 via a resistor network 28 to the line 22. The current pulse is of sufficient amplitude and duration to burn out a region of the line 22 having a constricted, or necked-down, cross sectional area which is smaller than a reference cross sectional area considered adequate for the reliable transmission of electric current. By way of example in the use of the invention, an adequate reference cross sectional area is one square mil.

The current pulse is generated by the discharge of a capacitor 30 through the resistor network 28. The capacitor 30 is initially charged by a power supply 32 to a nominal value of 310 volts. A bleeder circuit 34 is connected across the terminals of the capacitor 30 for discharging the capacitor 30 upon completion of the testing operation by the system 20. A current sensing resistor 36 is connected between the line 22 and ground 38 to permit a measuring of the test pulse current by a monitor 40 connected across the terminals of the resistor 36. In a preferred embodiment of the invention, the total resistance of the test current path provided by the series combination of the resistor network 28, the line 22 and the sensing resistor 36 is approximately 6.2 ohms to provide a nominal value of current of approximately 50 amperes in the test current pulse. The duration of the test current pulse is sufficiently short, approximately 50 microseconds, to prevent the dissipation of excessive energy in a defective line of the circuit board 24. The value of the sensing resistor 36 is substantially smaller than that of the test current path, the sensing resistor 36 having a value of 0.05 ohm in the preferred embodiment of the invention. The pulsing circuit 26 comprises an electronic switch 42 operative in response to a drive signal applied by a timing unit 44 via an AND gate 46 to the pulsing circuit 26.

The system 20 further comprises a resisitance measuring circuit 48 coupled by a mode selector switch 50 to the resistor network 28 for measuring the total resistance in the path of the test current pulse via the network 28, the line 22 and the sensing resistor 36. Included within the measuring circuit 48 are a pulse generator 52 and a bridge 54 with a meter 56 connected across side nodes of the bridge 54. The generator 52 is connected across the top and bottom nodes of the bridge 54. The bridge 54 is shown as an example of well-known resistance measuring devices, and includes a set of four resistive arms, one of which is the resistance of the test current path which is to be measured. The generator 52 produces a current pulse on line 58 to the mode switch 50 for the measurement of the resistance of the test current path. The resistance-measurement current pulse is of very much smaller amplitude than that of the test current pulse, a suitable measurement pulse having an amplitude of 500 milliamperes and a duration of 2 milliseconds.

In operation of the system 20, the resistance of the test current path is measured prior to application of the test current pulse to the circuit board 22. The path resistance is measured by operating the mode switch 50 to connect the network 28 via line 58 to the measuring circuit 48. Thereupon, the generator 52 applies a voltage pulse across the bridge 54 to produce the measurement pulse on line 58. The voltage sensed by the meter 56 is dependent of the state of balance of the bridge 54 and, therefore, may be used as a measure of the path resistance upon calibration of the meter 56 for a given value of output voltage of the generator 52. The meter 56 may be an analog reading meter for manual measurement and adjustment of the path resistance, or may be an analog-to-digital converter to provide a digitized measurement for use in an automated test system. The amplitude of the test current pulse is small enough to prevent any damage to the circuit board 24, but large enough to break down any contact resistance of probes 60 interconnecting the network 28 with the board 24 to insure reliable electrical connection.

After measuring the path resistance, the desired value of resistance is attained by operation of a set of switches 62, individual ones of which are connected across respective ones of the resisitors of the network 28. The resistance of the line 22 can be in the range of a few tenths of an ohm to several ohms, depending on the specific design of the circuit board 24. Typical values for individual ones of the resistors of the network 28 are shown in FIG. 1 for bringing the total path resistance up to the desired value. The switches can be operated manually or, in an automated system, the switches can be operated as relays. Thereby, upon implementation of the resistance measurement and setting procedure, the system 20 is ready to apply the test current pulse to the board 24 for testing the current carrying capacity of the line 22.

Figure 4:
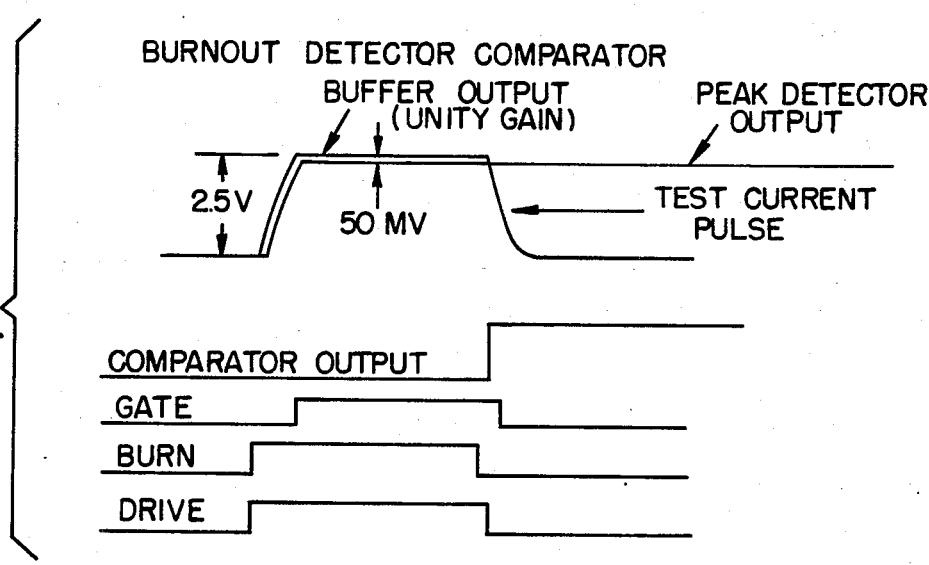
FIG. 4 shows a test current waveform present in the circuit of FIG. 3 with timing signals produced by circuitry of FIG. 1 for the case of a line conductor of good physical condition.

The timing unit 44 comprises well-known circuitry for generating a set of timing signals useful in the operation of the system 20 and, particularly, the monitor 40 for generating the test current pulse and for monitoring the waveform of the resultant current pulse flowing in the line 22. By way of example, the timing unit 44 is shown as comprising a trigger pulse generator 64, a delay unit 66 and three monostable flip-flops 68, 70 and 72. The timing signals produced by the unit 44 are the aforementioned drive signal, and also a reset signal, a burn signal and a gate signal which will be described hereinafter, and are identified in the drawing. The generator 64 generates the reset signal. The drive, the burn and the gate signals are produced respectively by the monostable flip-flops 68, 70 and 72. Each of the flip-flops 68, 70 and 72 is preset to provide a pulse of predetermined duration or width. The flip-flops 68 and 70 are triggered by the generator 64 directly; the flip-flop 72 is triggered by the generator 64 via the delay unit 66 so that the leading edge of the gate signal occurs after the leading edges of the drive, burn and test current signals as shown in FIG. 4. The reset, the burn and the gate signals are coupled by line 74 to the monitor 40. A termination signal, to be described subsequently, is generated by the monitor 40, and is coupled via line 76 and the AND gate 46 to shorten the duration of the test current pulse when necessary for protection of the circuit board 24 from possible damage. The termination signal disables the AND gate 46 to stop application of the drive signal to the pulsing circuit 26.

Figure 2:
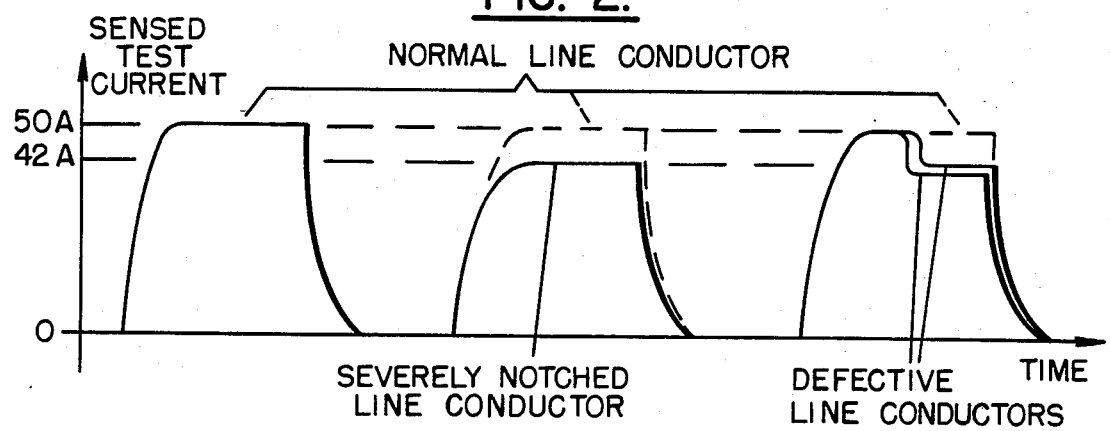
FIG. 2 shows current pulse waveforms resulting from the response of a line conductor of FIG. 1 to application of a test current pulse for differing physical conditions of the line conductor.

With reference also to FIG. 2, there are shown waveforms associated with the test current pulses applied to the circuit board 24 and sensed by the monitor 40 and the sensing resistor 36. Three separate situations are considered in the graph of FIG. 2. On the left side of the graph is shown the waveform of a current pulse passing through a properly constructed line 22 in the board 24, this waveform also being that of a voltage pulse developed across the sensing resistor 36 in response to the flow of the test current pulse through the resistor 36. This waveform is repeated, in phantom, in the center portion of the graph and at the right end of the graph. In the center portion of the graph, there is also shown a waveform in solid line depicting the situation wherein the line 22 of the circuit board 24 is defective, such as by a notch which severely constricts a region of the line 22 resulting in increased resistance and decreased current flow. The decreased current flow is evidenced by the reduced amplitude of the current waveform. By way of example, as shown in FIG. 2, a nominal value of 50 amperes is associated with a test current pulse in a normal line conductor of the board 24, while in the case of the severely notched line, the amplitude of the current may be reduced to 42 amperes. Such a drop in current is used as an indication of a defective line in the operation of the monitor 40, as will be described hereinafter.

At the right side of the graph of FIG. 2 are shown two possible current waveforms in solid line, both of the waveforms being characterized by an initial current amplitude of proper value, which value later drops to a lesser value due to destruction of a constricted portion of a defective line. In this situation, burnout is occurring during the interval of the test current pulse. Such burnout may occur at a latter or earlier point of time within the pulse waveform, and the decrease in current may vary depending on the circumstances of the burnout. Such differences in the effect of the burnout are represented by the two different waveforms shown in solid line. The sudden drop in current amplitude within the interval of the pulse waveform is used as an indication of a defective line in the operation of the monitor 40 as will be described hereinafter.

Two different phenomena have been observed upon a burnout of a line in the printed circuit board. A line with a severe neckdown exhibits a high resistance immediately upon the application of the 50 ampere test pulse, a conduction path through the defective line being maintained for the duration of the test current pulse. After termination of the test current pulse, the line is found to be open due to burnout of the constricted portion of the defective line. Such a situation is depicted in the center portion of the graph of FIG. 2. A further situation involving burnout of a defective line is that depicted on the right side of the graph of FIG. 2. In this case, the line resistance suddenly increases during the pulse, and the conduction path is again maintained for the duration of the pulse. After termination of the pulse, the line is found again to be open.

It is noted that the length of lines within the circuit board 24 vary, and that short lines will exhibit less resistance than long lines. In the case of longer lines which may have a resistance value as much as approximately 6 ohms, it has been noted that the line resistance increases during the current test due to heating. A temperature rise of 17°–25° C. may be experienced, and the resultant increase of resistance causes a corresponding decrease in current amplitude. This effect can be compensated by the insertion of slightly lower values of resistance in the resistor network 28. It is also noted that the voltage provided by the capacitor 30 decreases slightly during the interval of the test current pulse. At a nominal pulse voltage of 310 volts, the discharging of the capacitor 30 reduces the voltage by approximately 2 volts during the interval of the current pulse. After termination of the test current pulse, the power supply 32 recharges the capacitor 30 during the next 25 milliseconds. The bleeder circuit 34 draws 50–60 milliamperes continuously and serves to discharge the capacitor quickly when the system 20 is shut down, thereby to protect personnel by elimination of high voltage.

With reference now to FIG. 3, there are shown details in the construction of the monitor 40 of FIG. 1. The monitor 40 comprises two sections, namely, a burnout detection circuit 78 and a high/low current detection circuit 80. The gate, burn, and reset signals enter the monitor 40 via the line 74, and the terminate signal exits the monitor 40 via line 76. Both the lines 74 and 76 have been previously described with reference to FIG. 1. The burnout detection circuit 78 is utilized for the detection of the situation depicted on the right side of the graph of FIG. 2. The current detection circuit 80 is utilized for detection of the low current situation depicted in the center portion of the graph of FIG. 2, and is also used for detection of excessive current for protection of the circuit board 24. The monitor 40 is provided with indicators 82, 84 and 86 for indicating the presence, respectively, of a burnout situation, a high current situation and a low current situation to personnel operating the system 20.

The burnout detection circuit 78 comprises a buffer amplifier 88, coupled to the sensing resistor 36, a peak voltage detector 90 coupled to an output terminal of the amplifier 88, a buffer amplifier 92 connected to an output terminal of the detector 90, a level shifting circuit 94 coupled to an output terminal of the amplifier 92, a comparator 96 coupled to output terminals of both the shifting circuit 94 and the amplifier 88, and a logic unit 98 coupled to an output terminal of the comparator 96. The buffer amplifier 88 comprises an input resistor 100 coupling a positive input terminal of the amplifier 88 to a sense terminal of the resistor 36, a second input resistance 102 coupling the other sense terminal of resistance 36 to the negative terminal of the amplifier 88, a feedback resistor 104 coupling the output terminal of the amplifier 88 to it's negative input terminal and another resistor 105 coupling the positive input terminal of amplifier 88 to ground. The magnitudes of resistors 100, 102, 104, and 105 are selected to provide unity gain for the buffer amplifier 88. A line 106 connects the output terminal of the amplifier 88 to a negative input terminal of the comparator 96, and also to comparators 108 and 110 of the current detection circuit 80. The buffer amplifier 88 presents a relatively high impedance to the sensing resistor 36 so as to permit a measurement of the voltage drop across the resistor 36 without introducing any significant change to the value of current flowing therein.

The peak voltage detector 90 comprises an amplifier 112 having a differential input, an input resistor 114 coupling a positive input terminal of the amplifier 112 to the output terminal of the buffer amplifier 88, a pair of transistors 116 and 118 having their base terminals coupled by a resistor-capacitor coupling circuit 120 to an output terminal of the amplifier 112, a resistor 122 coupled between a negative source of voltage (−V) to the emitter terminal of the transistor 116, a line 124 coupling a feedback signal generated across the resistor 122 to a negative input terminal of the amplifier 112, and a resistor-capacitor holding circuit 126 coupled between an emitter terminal of the transistor 118 and ground. The coupling circuit 120 comprises a parallel combination of resistor and capacitor for the direct coupling of current from the amplifier 112 to the transistors 116 and 118. The holding circuit 126 also comprises a capacitor and a resistor connected in parallel, the capacitor storing charge therein provided by emitter current from the transistor 118, which charge is slowly dissipated via the resistor of the holding circuit 126. The junction of the emitter terminal of the transistor 118 with the holding circuit 126 comprises an output terminal of the peak voltage detector 90, which output terminal is coupled directly to a positive input terminal of the buffer amplifier 92. The collector terminals of the transistors 116 and 118 are coupled to a source of positive voltage (+V).

The buffer amplifier 92 includes a feedback resistor 128 connected between an output terminal of the amplifier 92 and a negative input terminal thereof to provide unity gain and to present a relatively high impedance to the holding circuit 126 so as to permit the capacitor of the holding circuit 126 to retain its charge until discharged by the resistor of the holding circuit 126.

The level shifting circuit 94 provides for a direct coupling of an output signal of the buffer amplifier 92 to a positive input terminal of the comparator 96, the shifting circuit 94 combining an offset voltage with the output signal of the amplifier 92 to shift the output signal of the amplifier 92 from the voltage appearing on line 106 from the amplifier 88. It is noted that the voltage on line 106 varies as a function of time to follow the instantaneous value of the voltage drop appearing across the sensing resistor 36. The voltage appearing at the output terminal of the buffer amplifier 92 is held to the peak value of the voltage drop across the resistor 36, which voltage drop corresponds to the waveforms which have been disclosed in FIG. 2. Thereby, the output signal of the buffer amplifier 92 in combination with the offset voltage of the shifting circuit 94 provides a reference signal for the comparator 96, against which reference signal the instantaneous voltage on line 106 is to be compared by the comparator 96.

The shifting circuit 94 includes a coupling resistor 130 which connects the output terminal of the amplifier 92 to the positive input terminal of the comparator 96. The shifting circuit 94 further comprises a current feed resistor 132 coupled between a negative source of voltage (−V') and the positive input terminal of the comparator 96, a transistor 134 having a collector terminal coupled to the positive input terminal of the comparator 96 and feeding collector current into the resistor 132, a potentiometer circuit 136 providing emitter current to the transistor 134 from a source of positive voltage (+V), a zener diode 138 coupled between a base terminal of the transistor 134 and the source of positive voltage (+V) for establishing a reference voltage across potentiometer circuit 136, thereby establishing emitter current to transistor 134, and a resistor 140 connecting the base terminal of the transistor 134 to ground. The amount of current drawn by the transistor depends on the setting of the potentiometer 136, which current flows through the resistor 132 to produce a voltage drop across the resistor 132. The voltage drop across the resistor 132 is summed together with voltage drop appearing across the resistor 130 to accomplish a shifting in the level of the voltage coupled by the resistor 130 from the buffer amplifier 92 to the comparator 96.

Figure 5:
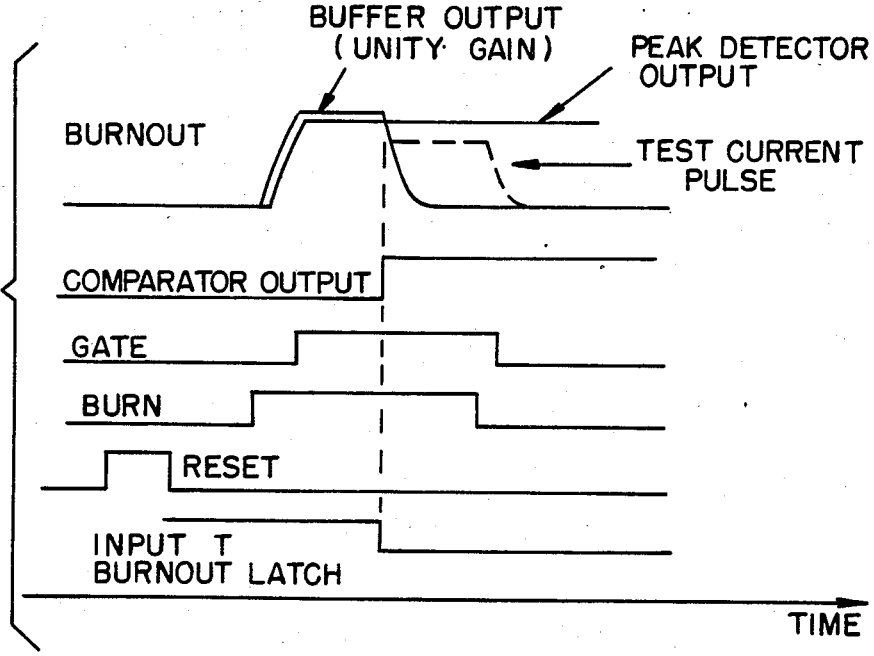
FIG. 5 shows a test current waveform present in the circuit of FIG. 3 with timing signals produced by circuitry of FIG. 1 for the case of a defective line conductor.

With reference also to FIGS. 4 and 5, the amount of level shifting imparted by the shifting circuit 94 is approximately 50 millivolts as is shown in the first trace in the graph of FIG. 4. Both figures show waveforms appearing in the monitor 40 wherein the vertical coordinate of the graph is in terms of volts, and the horizontal coordinate of the graph represents time. The 50 ampere test current pulse produces a voltage drop of 2.5 volts across the 0.05 ohm sensing resistor 36. Thus, the voltage waveform appearing in the first trace of FIG. 4 and in the first trace of FIG. 5 has a peak value 2.5 volts. As has been noted above, the capacitor 30 (FIG. 1) is charged to a value of 310 volts, and decays by 2 volts during the interval of the test current pulse. Upon comparing the ratio of the 2.5 volts of the voltage waveform of FIG. 4 to the 310 volts of the capacitor 30 (FIG. 1), it is readily seen that the decrease in voltage associated with the discharging of the capacitor 30 is approximately one third of the voltage offset of 50 millivolts shown in the first trace of FIG. 4. The 50 millivolt offset is much smaller than the total amplitude of the voltage waveform, the offset being only 2 percent of the 2.5 volt amplitude of the waveform (FIG. 4). Thus, the offset is sufficiently large to cover the droop in voltage associated with the capacitative discharge, and sufficiently small so as to be fully able to detect a drop in amplitude such as those shown in FIG. 2 so as to permit detection of a defective line.

The foregoing signal voltage relationships and the timing signals on line 74 are utilized by the logic unit 98 in determining the presence of a burnout situation wherein the measured current drops within the duration of the test current pulse, this being the situation depicted on the right side of the graph of FIG. 2. The logic unit 98 comprises an AND gate 142, two NAND gates 144 and 146, a latch 148 constructed as a set-reset flip-flop, and an OR circuit 150.

The operation of the logic unit 98 is explained with reference to the times of occurrence of the various signal waveforms as set forth in FIGS. 4 and 5. The output signal of the comparator 96 is depicted as the second trace in each of FIGS. 4 and 5, and is applied by the comparator 96 to an input terminal of the gate 142. The gate signal, appearing as the third trace in each of FIGS. 4 and 5 is transmitted via line 74 to a second input terminal of the gate 142, and also to an input terminal of an AND gate 152 of the current detection circuit 80. The leading edge of the gate signal occurs slightly after the leading edge of the test current pulse in order to desensitize the logic unit 98 to any ringing which may be present in the line 22 of the board 24 immediately after application of the test current pulse. The delayed occurrence of the gate signal is due to the action of the delay unit 66 as has been described above with reference to FIG. 1. As shown in FIGS. 4 and 5, the comparator output signal has a low or logic-0 value until the amplitude of the test current pulse drops below the reference level established by the peak voltage detector 90 and the level shifting circuit 94. In the case where no burnout occurs (FIG. 4), the comparator of the signal goes high, a logic-1, at the end of the test current pulse. In the case where burnout does occur (FIG. 5) the amplitude of the test current pulse drops below the reference level applied to the comparator 96 at an earlier time, in which case the comparator output signal goes high at an earlier time than that shown in FIG. 4. The gate 142 provides a logic-1 signal when both the comparator signal and the gate signal are at logic-1 states. The output signal of the gate 142 is combined with the burn signal by the gate 144 to produce an output logic signal which sets the latch 148. The setting of the latch 148 occurs upon burnout. With reference to FIG. 5, the setting of the latch 148 occurs upon the transition in the comparator signal from logic-0 to logic 1. In the case of FIG. 4, the transition in the comparator signal occurs after termination of the burn signal in which case there is no setting of the latch 148 by the gate 144. The output signal of the latch 148 is applied to the indicator 82 to indicate the occurrence of burnout. The output of the latch 148 is also combined with the burn signal by the gate 146 to provide a trigger pulse signal which is coupled by the OR circuit 150 to appear as the aforementioned terminate signal on line 76. Prior to the next application of the test current pulse, the reset signal from line 74 is applied to the latch 148 to reset the latch 148 for the next test of a line 22 in the circuit board 24.

The current detection circuit 80 comprises the aforementioned gate 152 and the comparators 108 and 110, and further comprises two NAND gates 154 and 156, and two latches 158 and 160. The latches 158 and 160 drive the indicators 84 and 86, respectively. The gate 152 receives the aforementioned gate signal and burn signal at its input terminals. The comparators 108 and 110 receive the aforementioned signal on line 106 from the buffer amplifier 88. Each of the comparators 108 and 110 also receive a reference signal against which the amplifier signal on line 106 is compared. The reference signal applied to the comparator 108 has a value of 3 volts, and the reference applied to the comparator 110 has a value of 2.25 volts. With reference to the first trace in FIG. 4, it is noted that the 2.5 volt amplitude of the test current pulse, as sensed across the resistor 36, is centered between the two values of the two reference signals applied to the comparators 108 and 110. Thus, the two comparators 108 and 110 serve as a window for ascertaining that the amplitude of the voltage waveform sent across the resistor 36 and, hence, the amplitude of the test current pulse fall within a desired range of values. The two reference signals applied to the comparators 108 and 110 may be provided by any convenient source (not shown) of voltage such as a voltage divider network coupled between the source of voltage (+V) and ground.

In operation, the gate 152 provides an output logic-1 signal in response to the simultaneous presence of the gate and the burn signals at the input terminals of the gate 152. The output logic-1 signal of the gate 152 is applied to each of the gates 154 and 156 for gating output signals of the respective comparators 108 and 110 to the latches 158 and 160, respectively. In the event that the current of the test pulse has an excessively high amplitude, such that the voltage on line 106 exceeds 3 volts, then the comparator 108 outputs a logic-1 signal which, in combination with the logic-1 signal from the gate 152, activate the gate 154 to set the latch 158. Similarly, in the event that the current of the test pulse is too low, such that the amplitude of the signal on line 106 is less than 2.25 volts, then the comparator 110 outputs a logic-1 signal which, in combination with the logic-1 signal of the gate 152, activate the gate 156 to set the latch 160. The output signal of the gate 154, in addition to being coupled to the set terminal of the latch 158, is also applied to an input terminal of the OR circuit 150. Similarly, the output signal of the gate 156, in addition to being applied to the set terminal of the latch 160 is also applied to an input terminal of the OR circuit 150. Accordingly, in the event of excessive current in the test pulse, the output signal of the gate 154 is coupled via the OR circuit 150 to appear as the terminate signal on the line 76; also, the indicator 84 is activated by the latch 158 to indicate excessively high current. Similarly, in the case of excessively low current in the test pulse, the output signal of the gate 156 is coupled via the OR circuit 150 to appear as the terminate signal on line 76; also the latch 160 activates the indicator 86 to show that the current is too low. Thereby, the terminate signal on line 76 is activated upon the presence of a burnout occurring within the duration of the test current pulse as provided by the burnout detection circuit 78, in the event of excessively high current as provided by the comparator 108 and the gate 154, and in the event of excessively low current as provided by the comparator 110 and the gate 156. The terminate signal on line 76 turns off the test current pulse to prevent damage to the circuit board 24 as has been described hereinabove with reference to FIG. 1.

Figure 6:
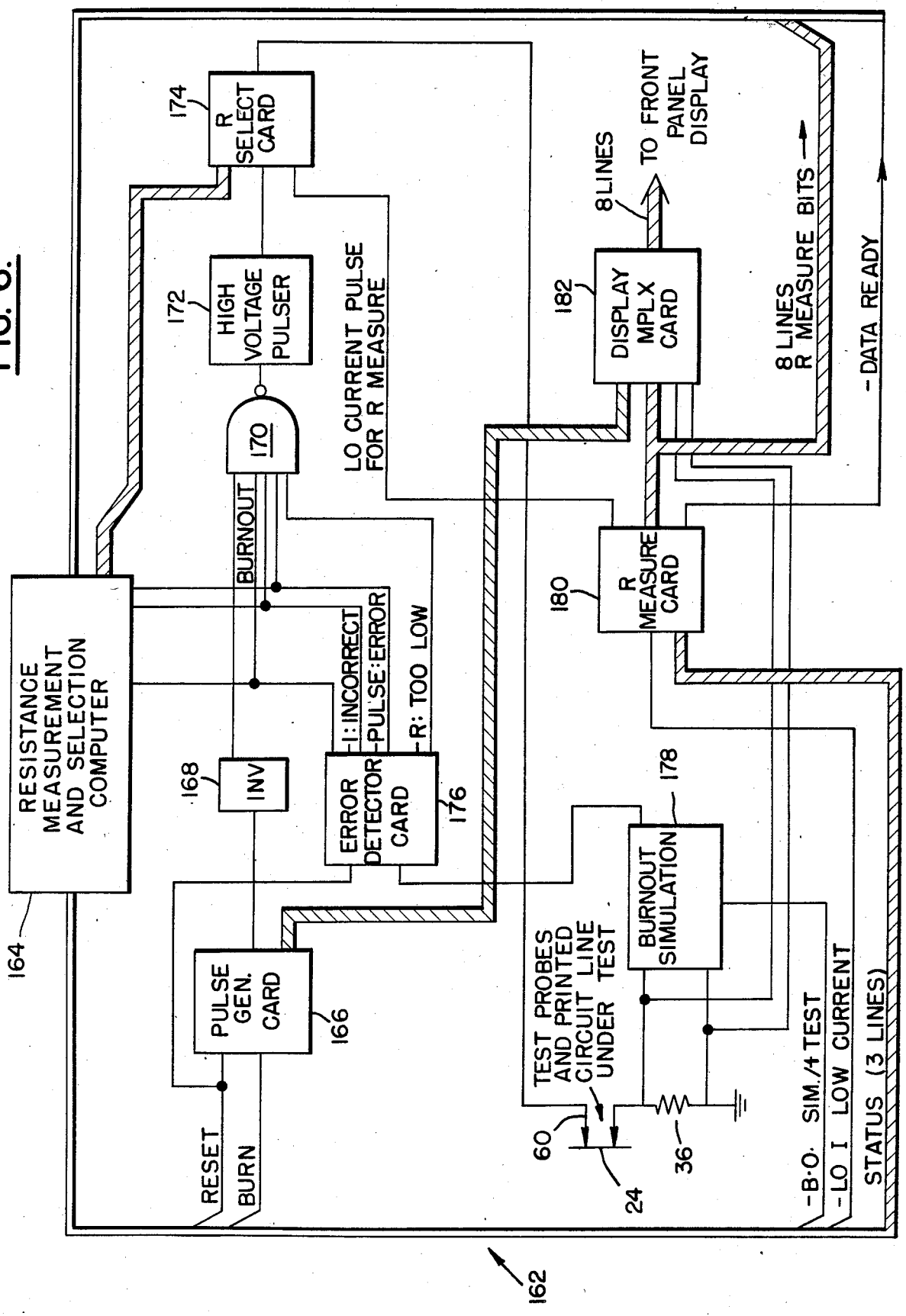
FIG. 6 is a block diagram of a form of automatic test equipment, and demonstrates the incorporation of the invention in such equipment.

With reference to FIG. 6, there is shown a system 162 including a computer 164 and components of the system 20 of FIG. 1 for automated operation of the testing process of the system 20 with resistance measurement and selection, associated with the network 28 (FIG. 1), being accomplished under control of the computer 164. The system 162 further comprises a pulse generator card 166, a digital inverter 168, a NAND gate 170, a high voltage pulser 172, a resistor selection card 174, an error detection card 176, a burnout simulator 178, a resistance measure card 180 and a display multiplex card 182.

In operation, the initial measurement of the resistance of the test current path is shown in FIG. 1 as extending through the mode selector switch 50, the resistor network 28, the printed circuit line 22 and the sensing resistor 36. The initial measurement is accomplished by the system 162 with the corresponding test current path extending from the high voltage pulser 172 through a closed contact on the resistor selection card 174, the probes 60, the circuit board 24 and the sensing resistor 36 as shown in FIG. 6. The high voltage pulser 172 comprises the following components of FIG. 1, namely, the power supply 32, the bleeder circuit 34, the capacitor 30 and the pulsing circuit 26. The resistor selection card 174 comprises the resistor network 28 of FIG. 1. The resistance measure card 180 comprises the resistance measuring circuit 48 of FIG. 1. The mode selection function of the switch 50 (FIG. 1) is accomplished within the computer 164 (FIG. 6). The meter 56 of FIG. 1 is implemented by means of an analog-to-digital converter (not shown) wherein the digital output is read by the computer 164. FIG. 6 shows digital busses and analog signal lines providing electrical connection amohg the various components of the system 162, in particular, a connection between the resistance measure card 180 with the computer 164 and connection of the resistor selection card 174 with the computer 164. The computer 164 activates the resistance measure card 180 to apply the measurement current pulse by the resistor selection card 174 to the circuit board 24. Upon reading the amount of resistance in the test current path, the computer 164 then activates a set of relays in the resistor selection card 174 for operating respective ones of the switches 62 (FIG. 1) to select the desired values of resistance (FIG. 1) to attain a path resistance, typically, of 6.2 ohms. Thereafter, the computer 164 activates the high voltage pulser 172 by applying a control signal via the gate 170 to the pulser 172. Activation of the high voltage pulser 172 results in the reduction of the voltage pulse of 310 volts (disclosed above in FIG. 1 with reference to the capacitor 30 and the switch 42) to provide the test current pulse of approximately 50 amperes. The use of the capacitive discharge circuit of FIG. 1 and the pulser 172 is preferred over the use of a current source in that the energy at burnout would be greater with a current source and, therefore, more likely to damage the board.

The error detection card 176 includes circuitry for monitoring the current amplitude, the pulse width, the total resistance in the circuit path, and further incorporates circuitry of the monitor 40 (FIG. 1) which acts to shut down the test current pulse if burnout or other improper current condition exists.

The burnout simulator 178 includes circuitry for providing an additional function, not found in the system 20 of FIG. 1, for operation of the system 162 in a diagnostic mode to insure that the burnout detector operation of the monitor 40 is operating properly. Also, the display multiplex card 182 is useful in providing an engineering/maintenance aid in the display of pulse amplitude, width or circuit path resistance.

The pulse generator card 166 includes circuitry corresponding to that of the timing unit 44 (FIG. 1), and generates the burn signal applied to circuitry of the monitor 40 (FIGS. 1 and 3). In the generation of the burn signal, it is preferable to enlarge the width of the burn signal to a duration of 55 microseconds to allow for rise and fall times of the test current pulse.

With respect to further comparison of the circuitry of the system 20 and the system 162, the gate 170 cooperates with the computer 164 and the error detection card 176, including the circuitry of the monitor 40 contained therein, for terminating the test current pulse in the event that burnout or other failure occurs. The function of the gate 170 is, therefore, analogous to that provided by the gate 46 (FIG. 1) and the OR circuit 150 (FIG. 3).

The inverter 168 is employed to provide the appropriate logic state to timing signals coupled from the pulse generator card 160 to the gate 170. The display multiplex card 182 receives data signals from other ones of the components of the system 162, the data being communicated via the busses shown in FIG. 6, and transmits the data to a display (not shown) such as would be presented on the front panel of automated test equipment (not shown).

In view of the foregoing description of the system 162 of FIG. 6 it is apparent that the system 20 of the invention has been constructed in a manner which permits the invention to be incorporated into an automated test system for verifying the current carrying capacities of printed circuit lines in a circuit board.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

I claim:

1. A system for testing current capacity of a printed line conductor comprising:
    switch means in circuit with said conductor for switching a current thereto;
    pulse applying means operatively connected to said switch means for applying a test current pulse to said conductor, said pulse having sufficient power over a predetermined interval of time to burn out a constricted region of a printed line conductor having a cross sectional area less than a predetermined amount of area, said pulse applying means including timing means for driving said switch means and establishing said predetermined time interval, said timing means further providing a burnout time signal which terminates prior to said test pulse to designate a burnout time of shorter duration than said test pulse;
    means for monitoring the waveform of a test pulse of current flowing in said conductor as a function of time to determine a condition of said conductor, said waveform varying in accordance with the condition of said conductor, said monitoring means providing a signal designating a type of waveform;
    logic means operatively connected to said switch means and responsive to said signal of said monitoring means and to said burnout signal for terminating a flow of the current prior to the end of said predetermined interval when the waveform of said current pulse indicates the occurence of a burnout in said conductor, said logic means operating said switch means to terminate said test current pulse prior to said predetermined interval when said monitoring means indicates a burnout during said burnout time signal; and
    wherein said monitoring means comprises means for detecting a peak amplitude of said test current pulse; and means for detecting a stepwise shift in current amplitude from a first current level to a second current current level within the duration of said current pulse, an occurrence of said stepwise shift during said burnout time signal designating a burnout of said conductor.

2. A system according to claim 1 wherein said monitoring means further comprises means for offsetting said peak amplitude to establish a reference signal, and means for comparing the instantaneous amplitude of said test current pulse with said reference signal to provide a comparison signal indicative of a variation in the instantaneous amplitude of said test current pulse in accordance with a type of said waveform.

3. A system according to claim 2 wherein said timing means applies said test current pulse with a predetermined duration so as to prevent the dissipation of excessive energy in said printed circuit board.

4. A system according to claim 3 wherein said timing means includes means for providing a set of timing signals including said burnout time signal which bracket predetermined portions of said test current pulse, one of said timing signals beginning after the leading edge of said current pulse, and said burnout time signal terminating before a trailing edge of said current pulse.

5. A system according to claim 4 wherein said logic means combines said comparison signal with said timing signals to provide a signal designating a type of test current waveform.

6. A system according to claim 5 wherein said monitoring means further comprises window comparison means comparing the instantaneous amplitude of said test current pulse with a set of reference signals, said logic means combining output signals of said window comparison means with said timing signals to provide a further signal designating a type of test current waveform.

7. A system according to claim 6 wherein said logic means includes means responsive to each of said signals designating a type of test current waveform for transmitting a terminate signal to said pulse applying means to terminate said test current pulse.

8. A system according to claim 7 wherein said pulse applying means comprises a capacitor, means for charging said capacitor, discharge means for discharging said capacitor, and a resistance network interconnecting said pulse-applying means with said conductor, said pulse-applying means applying a pulse of electric energy from said capacitor to said conductor via said network, and wherein said pulsing means is operative in accordance with said timing signals and said terminate signal for initiation and termination of said test current pulse.

* * * * *